(12) United States Patent
Ha et al.

(10) Patent No.: US 7,715,240 B2
(45) Date of Patent: May 11, 2010

(54) CIRCUIT AND METHOD OF GENERATING HIGH VOLTAGE FOR PROGRAMMING OPERATION OF FLASH MEMORY DEVICE

(75) Inventors: Hyun-Chul Ha, Gyeonggi-do (KR); Jong-Hwa Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/235,328

(22) Filed: Sep. 22, 2008

(65) Prior Publication Data

US 2009/0016114 A1 Jan. 15, 2009

Related U.S. Application Data

(62) Division of application No. 11/361,579, filed on Feb. 24, 2006, now Pat. No. 7,443,758.

(51) Int. Cl.
*G11C 11/03* (2006.01)

(52) U.S. Cl. .............. 365/185.24; 365/185.09; 365/185.28; 365/226

(58) Field of Classification Search ............ 365/185.24, 365/185.28, 189.09, 226
See application file for complete search history.

(56) References Cited

U.S. PATENT DOCUMENTS 5,394,365 A * 2/1995 Tsukikawa .............. 365/189.09

| | | | | |
|---|---|---|---|---|
| 5,805,508 A * | 9/1998 | Tobita | .............. | 365/189.09 |
| 6,181,629 B1 * | 1/2001 | Ogura | .............. | 365/227 |
| 6,385,086 B1 * | 5/2002 | Mihara et al. | .............. | 365/185.11 |
| 6,707,716 B2 | 3/2004 | Natori | | |
| 2005/0036395 A1 | 2/2005 | Maejima et al. | | |

FOREIGN PATENT DOCUMENTS

| JP | 2002-142448 | 5/2002 |
|---|---|---|
| JP | 2003-123495 | 4/2003 |
| KR | 10-0223480 | 7/1999 |

OTHER PUBLICATIONS

English language abstract of Korean Publication No. 10-0223480.
English language abstract of Japanese Publication No. 2002-142448.
English language abstract of Japanese Publication No. 2003-123495.

* cited by examiner

*Primary Examiner*—Pho M. Luu
(74) *Attorney, Agent, or Firm*—Stanzione & Kim, LLP

(57) ABSTRACT

Provided is a high voltage generator for a flash memory device including a voltage pumping unit configured to generate a high voltage in response to a pumping clock signal, a transistor having a gate coupled to the high voltage and a source coupled to a program voltage, a voltage distributor coupled to the drain of the transistor, the voltage distributor configured to generate a distributor voltage, and a pumping clock controller configured to compare the distributor voltage to a reference voltage and to generate the pumping clock signal when the high voltage is less than a voltage substantially equal to the program voltage plus the threshold voltage of the transistor.

4 Claims, 4 Drawing Sheets

CIRCUIT AND METHOD OF GENERATING HIGH VOLTAGE FOR PROGRAMMING OPERATION OF FLASH MEMORY DEVICE

CROSS-REFERENCE TO RELATED PATENT APPLICATION

This application is a Divisional of U.S. Ser. No. 11/361,579, filed on Feb. 24, 2006, now U.S. Pat. No. 7,443,758, which claims priority from Korean Patent Application No. 10-2005-0052010, filed on Jun. 16, 2005, all of which are hereby incorporated by reference in their entirety.

BACKGROUND OF THE INVENTION

1. Field of the Invention

This application relates to semiconductor memory devices, and more particularly, to a circuit and method of generating a high voltage for a programming operation of flash memory devices.

2. Description of the Related Art

With the development of digital information communication networks, such as the Internet, used by devices such as personal digital assistants and cellular phones, nonvolatile memory devices are useful as memory devices capable of storing information of a mobile terminal in a nonvolatile manner. The nonvolatile memory device includes a flash memory that can electrically erase stored data and electrically write data.

The flash memory includes sectors, each including memory cells. The flash memory erases memory cell data block by block (sector by sector) and programs data in every memory cell. A NAND type flash memory is increasingly used because its integration and memory capacity is comparable to a dynamic RAM. The NAND type flash memory is constructed such that memory strings each include serially connected memory cells. The memory cells are serially connected between bit lines and source lines. The memory strings are arranged to construct a memory cell array.

FIG. 1 is a block diagram of a conventional flash memory device 100. Referring to FIG. 1, the flash memory device 100 includes a unit block memory cell array 110, a wordline decoder 120, and a high voltage generator 130. The flash memory device 100 may include several unit block memory cell arrays 110. Wordline decoders are arranged corresponding to each unit block memory cell array 110. For convenience of explanation, FIG. 1 illustrates a single wordline decoder 120 corresponding to the unit block memory cell array 110.

The block memory cell array 110 includes memory strings CS connected to n bit lines BL0, BL1, . . . , BLn−1. The memory strings CS are commonly connected to a source line CSL. The gates of memory cells M0 through M15 of the memory strings CS are connected to wordlines WL0 through WL15. The gates of string select transistors SST respectively connecting the memory strings CS to the bit lines BL0, BL1, . . . , BLn−1 are connected to a string select line SSL. The gates of ground select transistors GST connecting the memory strings CS to the common source line CSL are connected to a ground select line GSL.

The wordline decoder 120 selectively activates the string select line SSL, ground select line GSL and wordlines WL0 through WL15 of the memory cell array 110. The wordline decoder 120 includes a decoder 122 and a wordline driver 124. The decoder 122 receives address signals ADDR to generate wordline driving signals S0 through S15, a string select voltage VSSL and a ground select voltage VGSL. The wordline driver 124 respectively transfers the wordline driving signals S0 through S15, string select voltage VSSL and ground select voltage VGSL to the wordlines WL0 through WL15, string select line SSL and ground select line GSL.

The decoder 122 decodes the received address signals ADDR to provide corresponding driving voltages, for example, a program voltage Vpgm, an erase voltage Verase, a read voltage Vread or a pass voltage Vpass, to the string select line SSL, wordlines WL0 through WL15 and ground select line GSL in a programming operation, an erase operation or a read operation.

The wordline driver 124 includes high-voltage pass transistors SN, WN0 through WN15, GN and CN respectively connected between the string select voltage VSSL, the wordline driving signals S0 through S15, the ground select voltage VGSL, and a common source line voltage VCSL and the string select line SSL, the wordlines WL0 through WL15, the ground select line GSL, and the common source line CSL. A block wordline BLKWL to which the gates of the high-voltage pass transistors SN, WN0 through WN15, GN and CN are connected is provided with a high voltage VPP generated by the high voltage generator 130.

The high voltage generator 130 generates the high voltage VPP according to a charge pumping operation when it is provided with a pumping clock signal CLK_VPP. The high voltage generator 130 is illustrated in FIG. 2 in detail.

Referring to FIG. 2, the high voltage generator 130 includes a voltage pumping unit 210, a pumping clock controller 220, and a voltage trimming controller 230. The voltage pumping unit 210 performs a charge pumping operation in response to the pumping clock signal CLK_VPP to generate the high voltage VPP.

The pumping clock controller 220 includes a comparator 222 and a NAND gate 224. The comparator 222 receives a first voltage VPP1 dropped from the high voltage VPP by a voltage across a first resistor Ra through its non-inverting port and receives a reference voltage Vref through its inverting port to compare the first voltage VPP1 to the reference voltage Vref. The comparator 222 generates a logic high level signal when the first voltage VPP1 is lower than the reference voltage Vref and generates a logic low level signal when the first voltage is higher than the reference voltage Vref. The NAND gate 224 receives a clock signal OSC, a control signal Control and the output signal of the comparator 222 and generates the pumping clock signal CLK_VPP. The control signal Control instructs the high voltage VPP to be generated.

Thus, the pumping clock controller 220 generates the pumping clock signal CLK_VPP in response to the clock signal OSC when the control signal Control and the output signal of the comparator 222 have a logic high level. When any one of the control signal Control and the output signal of the comparator 22 has a logic low level, the pumping clock controller 220 does not generate the pumping clock signal CLK_VPP.

The voltage trimming controller 230 includes first, second and third resistors Ra, Rb and Rc, a first resistor trimming part 232, and a second resistor trimming part 234. The first resistor Ra is connected between the high voltage VPP and the first voltage VPP1 and the second resistor Rb is connected between the first voltage VPP1 and a second voltage VPP2 that is the output of the first resistor trimming part 232. The third resistor Rc is connected between the first voltage VPP1 and a third voltage VPP3 that is the output of the second resistor trimming part 234.

The first resistor trimming part 232 is connected between the second voltage VPP2 and a ground voltage VSS and includes a plurality of resistors R1, R2 and R3 and a plurality of transistors M1, M2 and M3. The resistors R1, R2 and R3 are serially connected to the transistors M1, M2 and M3, respectively. The gates of the transistors M1, M2 and M3 respectively receive first trimming signals VPP_Set1<2:0>. The level of the second voltage VPP2 is varied by the transistors M1, M2 and M3 selectively turned on in response to the first trimming signals VPP_Set1<2:0>.

The second resistor trimming part 234 is connected between the third voltage VPP3 and the ground voltage VSS and includes a plurality of resistors R4, R5 and R6 and a plurality of transistors M4, M5 and M6. The resistors R4, R5 and R6 are serially connected to the transistors M4, M5 and M6, respectively. The gates of the transistors M4, M5 and M6 respectively receive second trimming signals VPP_Set2<2:0>. The level of the third voltage VPP3 is varied by the transistors M4, M5 and M6 selectively turned on in response to the second trimming signals VPP_Set2<2:0>.

As a result, in the voltage trimming controller 230, the voltage across the second resistor Rb and the second voltage VPP2 of the first resistor trimming part 232 are connected in parallel with the voltage across the third resistor Rc and the third voltage VPP3 of the second resistor trimming part 234 to generate the first voltage VPP1, and the first voltage VPP1 is increased by the voltage across the first resistor Ra to generate the high voltage VPP. Here, the level of the high voltage VPP is varied in response to the first trimming signals VPP_Set1<2:0> and the second trimming signals VPP_Set2<2:0>.

The high voltage VPP generated by the high voltage generator 130 is provided to the block wordline BLKWL of FIG. 1. In the flash memory device 100 of FIG. 1, the program voltage Vpgm may be applied to a wordline enabled in a programming operation, for example, the first wordline WL0. The pass voltage Vpass may be applied to the other wordlines WL1 through WL15. To apply the program voltage Vpgm provided by the decoder 122 to the first wordline WL0, the program voltage Vpgm is applied to the wordline signal S0 and the high voltage VPP is provided to the block wordline BLK to turn on the pass transistor WN0.

Here, the program voltage Vpgm is increased according to the number of programming times to reach approximately 15 through 20V. The high voltage VPP has a level ranging from at least the level of the program voltage to a voltage level as high as the threshold voltage Vth of the pass transistor WN0 in order to transfer the program voltage Vpgm without having a voltage drop. However, the high voltage VPP generated by the high voltage generator 130 has a sufficiently high voltage, for example, 22 through 25V, irrespective of the level of the program voltage Vpgm. The high voltage VPP has a fixed level determined by adding the threshold voltage Vth of the high voltage pass transistors SN0, WL0 through WL15, GN and CN to the maximum program voltage Vpgm.

However, the threshold voltage Vth of the pass transistors SN0, WL0 through WL15, GN and CN may vary within a semiconductor fabrication process. As a result, the high voltage generator 130 requires a trimming operation that selectively activates the first and second trimming signals VPP_Set1<2:0> and VPP_Set2<2:0> to control the level of the high voltage VPP.

In practice, an appropriate voltage level of the block wordline BLKWL for transferring the program voltage Vpgm to the wordlines WL0 through WL15 when the flash memory device performs the programming operation is the program voltage Vpgm plus the threshold voltage Vth of the high voltage pass transistors SN0, WL0 through WL15, GN and CN. However, the high voltage generator 130 causes unnecessary power consumption because it generates the high voltage VPP fixed to a sufficiently high voltage level irrespective of the level of the program voltage Vpgm. Furthermore, the high voltage generator 130 requires the trimming operation using the first and second trimming signals VPP_Set1<2:0> and VPP_Set2<2:0> in order to change the fixed level of the high voltage VPP.

Accordingly, there is a need for a high voltage generator capable of providing a high voltage as high as the current program voltage plus the threshold voltage of the high voltage pass transistors SN0, WL0 through WL15, GN and CN in the event of the programming operation.

SUMMARY OF THE INVENTION

An embodiment include a high voltage generator for a flash memory device including a voltage pumping unit configured to generate a high voltage in response to a pumping clock signal, a transistor having a gate coupled to the high voltage and a source coupled to a program voltage, a voltage distributor coupled to the drain of the transistor, the voltage distributor configured to generate a distributor voltage, and a pumping clock controller configured to compare the distributor voltage to a reference voltage and to generate the pumping clock signal when the high voltage is less than a voltage substantially equal to the program voltage plus the threshold voltage of the transistor.

Another embodiment includes a method of generating a high voltage for a programming operation of a flash memory device including generating a program voltage, and changing the high voltage until the high voltage is substantially equal to the program voltage plus the threshold voltage of a high voltage transistor.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF THE INVENTION

Figure 1:
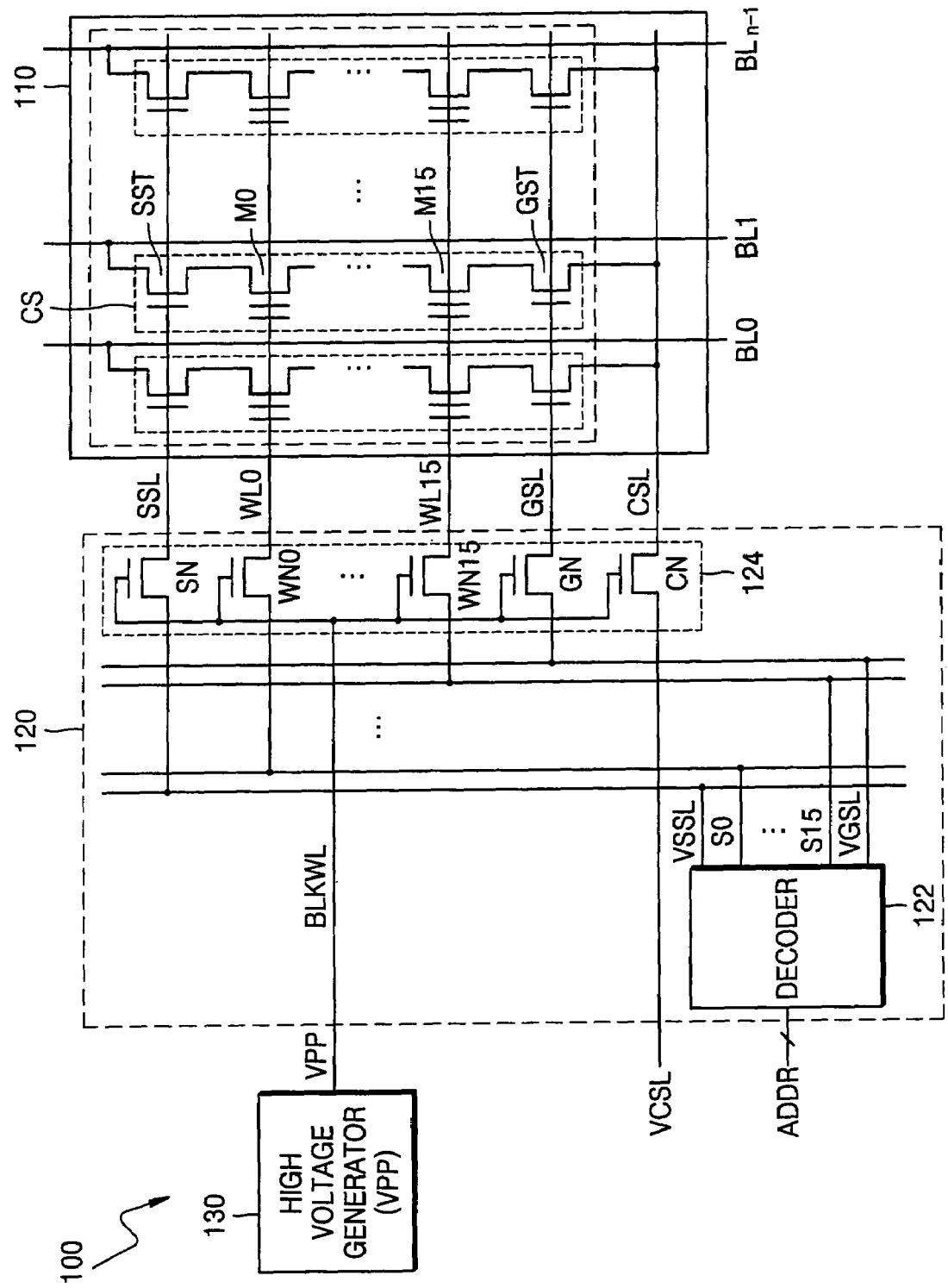
FIG. 1 is a block diagram of a conventional flash memory device.
Figure 2:
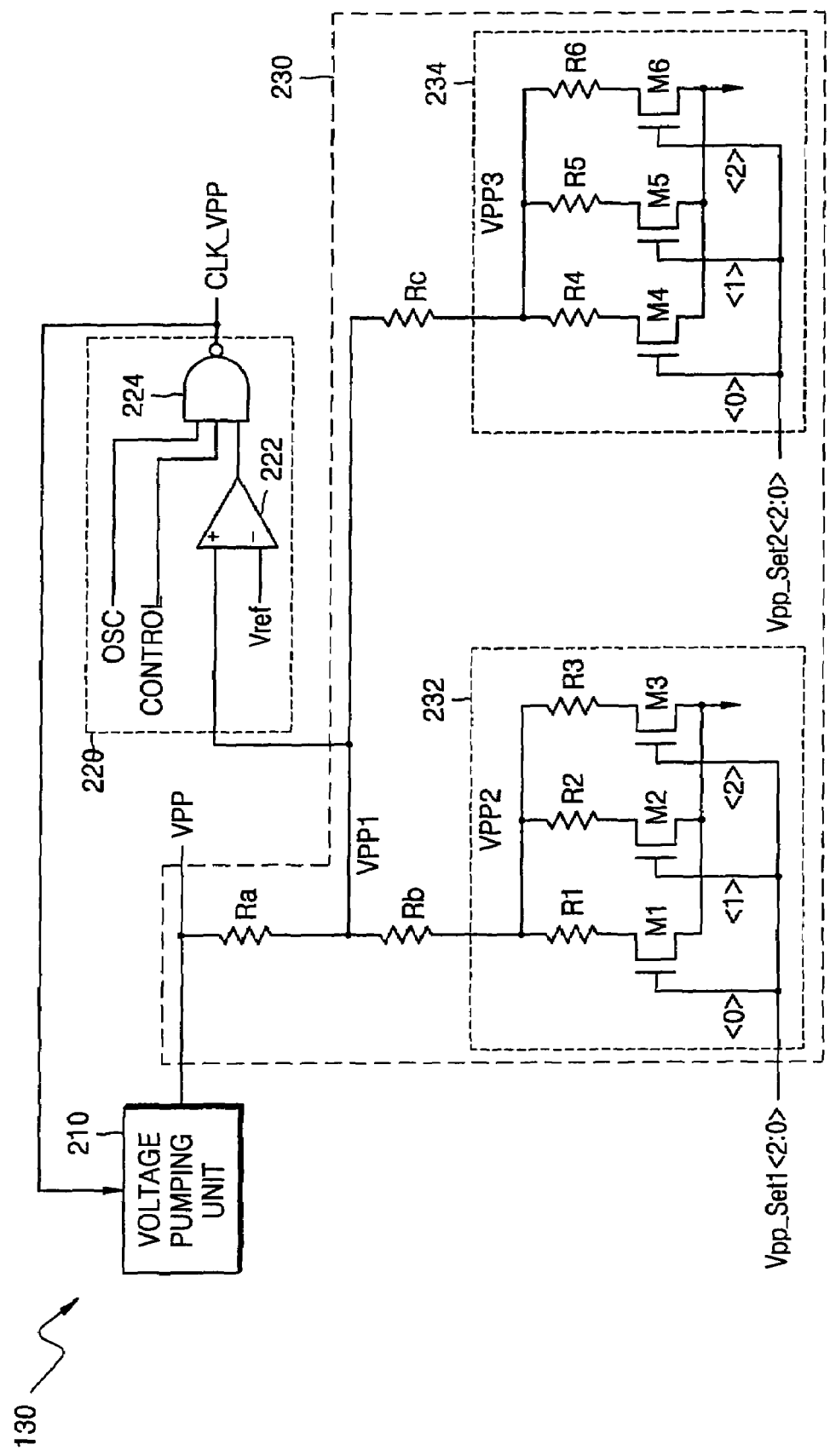
FIG. 2 is a block diagram of the high voltage generator of FIG. 1.

Embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

An example of a high voltage generator may be included in a flash memory device. The high voltage generator replaces the high voltage generator 130 of the aforementioned flash memory device 100 shown in FIG. 1. The flash memory device applies a program voltage to wordlines of flash memory cells in a programming operation mode. The high voltage generator generates a high voltage VPP higher than the current program voltage level by the threshold voltage Vth of a high voltage transistor and provides the high voltage VPP to a block wordline BLKWL in the programming operation mode.

Figure 3:
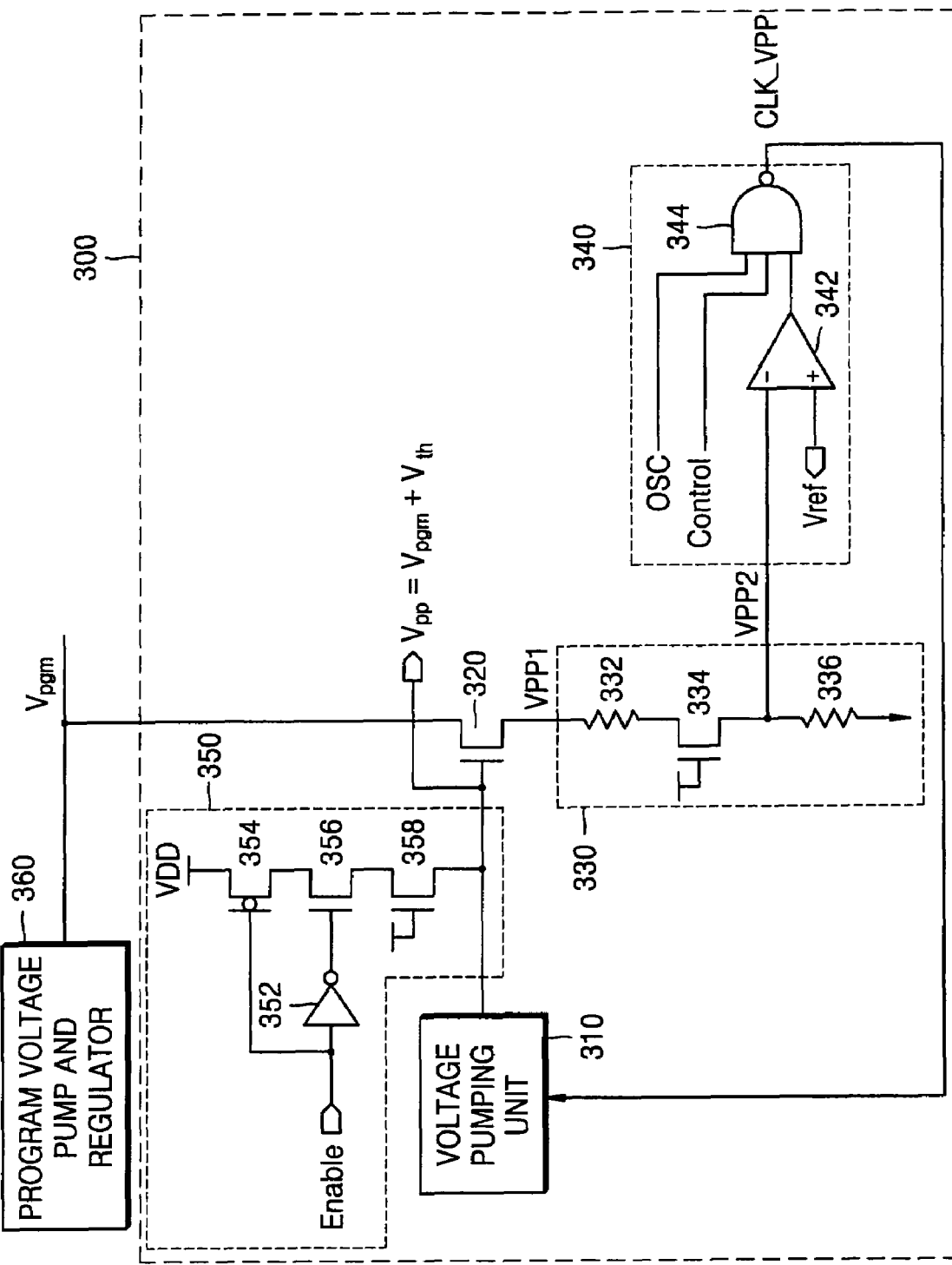
FIG. 3 is a block diagram of a high voltage generator according to an embodiment.

FIG. 3 is a block diagram of a high voltage generator 300 according to an embodiment. Referring to FIG. 3, the high voltage generator 300 includes a voltage pumping unit 310 generating the high voltage VPP in response to a pumping clock signal CLK_VPP. The voltage pumping unit 310 includes capacitors and may continuously perform a pumping operation using the capacitors to increase the level of the high voltage VPP. The voltage pumping unit 310 is well known in the art so that detailed explanation therefor is omitted.

The high voltage VPP generated by the voltage pumping unit 310 is applied to the gate of a transistor 320. The source of the transistor 320 is connected to a program voltage Vpgm. The program voltage Vpgm is generated by a program voltage pump and regulator 360. The program voltage pump and regulator 360 is one of voltage generators included in the flash memory device and generates the program voltage Vpgm. The program voltage pump and regulator 360 include capacitors and generates the program voltage Vpgm according to a pumping operation through the capacitors. The program voltage Vpgm is increased according to the number of programming times of the flash memory cells.

The transistor 320 has substantially the same size as the high voltage pass transistors SN0, WL0 through WL15, GN and CN included in the wordline decoder 120 shown in FIG. 1. As a result, the transistor 320 has the same characteristic as those of the high voltage pass transistors SN0, WL0 through WL15, GN and CN. The drain of the transistor 320 is connected to a voltage distributor 330. A node between the drain of the transistor 320 and the voltage distributor 330 becomes a node of a first voltage VPP1.

The voltage distributor 330 includes a first resistor 332, a transistor 334, and a second resistor 336, serially connected between the node of the first voltage VPP1 and a ground voltage VSS. The gate of the transistor 334 is connected to a power supply voltage VDD and its source is connected to the first resistor 332. In addition, the drain of the transistor 334 is connected to the second resistor 336. A node between the drain of the transistor 334 and the second resistor 336 becomes a node of a second voltage VPP2. The voltage distributor 330 is set such that the second voltage VPP2 is identical to the reference voltage Vref when the first voltage VPP1 corresponds to the program voltage Vpgm. As used herein, the second voltage VPP2 may be referred to as a distributor voltage.

A pumping clock controller 340 includes a comparator 342 to compare the second voltage VPP2 to the reference voltage Vref, and a NAND gate 344 to receive a clock signal OSC, a control signal Control and the output signal of the comparator 342 to generate the pumping clock signal CLK_VPP. The comparator 342 receives the second voltage VPP2 through its non-inverting port and receives the reference voltage Vref through its inverting port to compare the second voltage VPP2 and the reference voltage Vref to each other. The comparator 342 generates a logic high signal when the second voltage VPP2 is lower than the reference voltage Vref and generates a logic low signal when the second voltage VPP2 is identical to or high than the reference voltage Vref.

The pumping clock controller 340 generates the pumping clock signal CLK_VPP in response to the clock signal OSC when the control signal Control instructing the high voltage VPP to be generated and the output signal of the comparator 342 both have a logic high level. When any one of the control signal Control and the output signal of the comparator 342 has a logic low level, the pumping clock controller 340 does not generate the pumping clock signal CLK_VPP. Thus, the pumping clock signal CLK_VPP is generated when the control signal Control is activated to a logic high level and the second voltage VPP2 is lower than the reference voltage Vref.

A high voltage discharging unit 350 discharges the high voltage VPP to the power supply voltage VDD in response to an enable signal Enable instructing the high voltage VPP to be discharged when the programming operation is finished. The high voltage discharging unit 350 includes an inverter 352, a PMOS transistor 354, and first and second NMOS transistors 356 and 358. The inverter 352 inverts the enable signal Enable. The source of the PMOS transistor 354 is connected to the power supply voltage VDD and its gate is connected to the enable signal Enable. The source of the first NMOS transistor 356 is connected to the drain of the PMOS transistor 354 and its gate is connected to the inverted signal of the enable signal Enable. The source of the second NMOS transistor 358 is connected to the drain of the first NMOS transistor, its gate is connected to the power supply voltage VDD, and its drain is connected to the high voltage VPP.

In the high voltage discharging unit 350, the PMOS transistor 354 and the first NMOS transistor 358 are turned on when the enable signal Enable is activated to a logic low level. Accordingly, a current path is formed from the high voltage VPP to the power supply voltage VDD through the PMOS transistor 352 and the first and second NMOS transistors 354 and 356 such that the high voltage VPP is discharged to the power supply voltage VDD.

When the high voltage VPP that is the output of the voltage pumping unit 310 has a voltage level higher than the program voltage Vpgm by the threshold voltage Vth of the transistor 320, the transistor 320 is turned on such that the first voltage VPP1 becomes identical to the program voltage Vpgm and the second voltage VPP2 becomes identical to the reference voltage Vref. Accordingly, the output signal of the comparator 342 becomes a logic low level and the pumping clock signal CLK_VPP is set to a logic high level, and thus the voltage pumping unit 310 does not perform the pumping operation. As a result, the high voltage has a voltage level corresponding to the program voltage Vpgm plus the threshold voltage Vth of the transistor 320.

When the high voltage VPP does not correspond to the program voltage Vpgm plus the threshold voltage Vth of the transistor 320, the transistor 320 is turned off such that the second voltage VPP2 becomes lower than the reference voltage Vref. Accordingly, the output signal of the comparator 342 becomes a logic high level and the pumping clock signal CLK_VPP is generated in response to the clock signal OSC, and thus the voltage pumping unit 30 carries out the pumping operation in response to the pumping clock signal CLK_VPP. The voltage pumping unit 310 performs the pumping operation until the high voltage VPP becomes identical to the program voltage Vpgm plus the threshold voltage Vth of the transistor 320.

Figure 4:
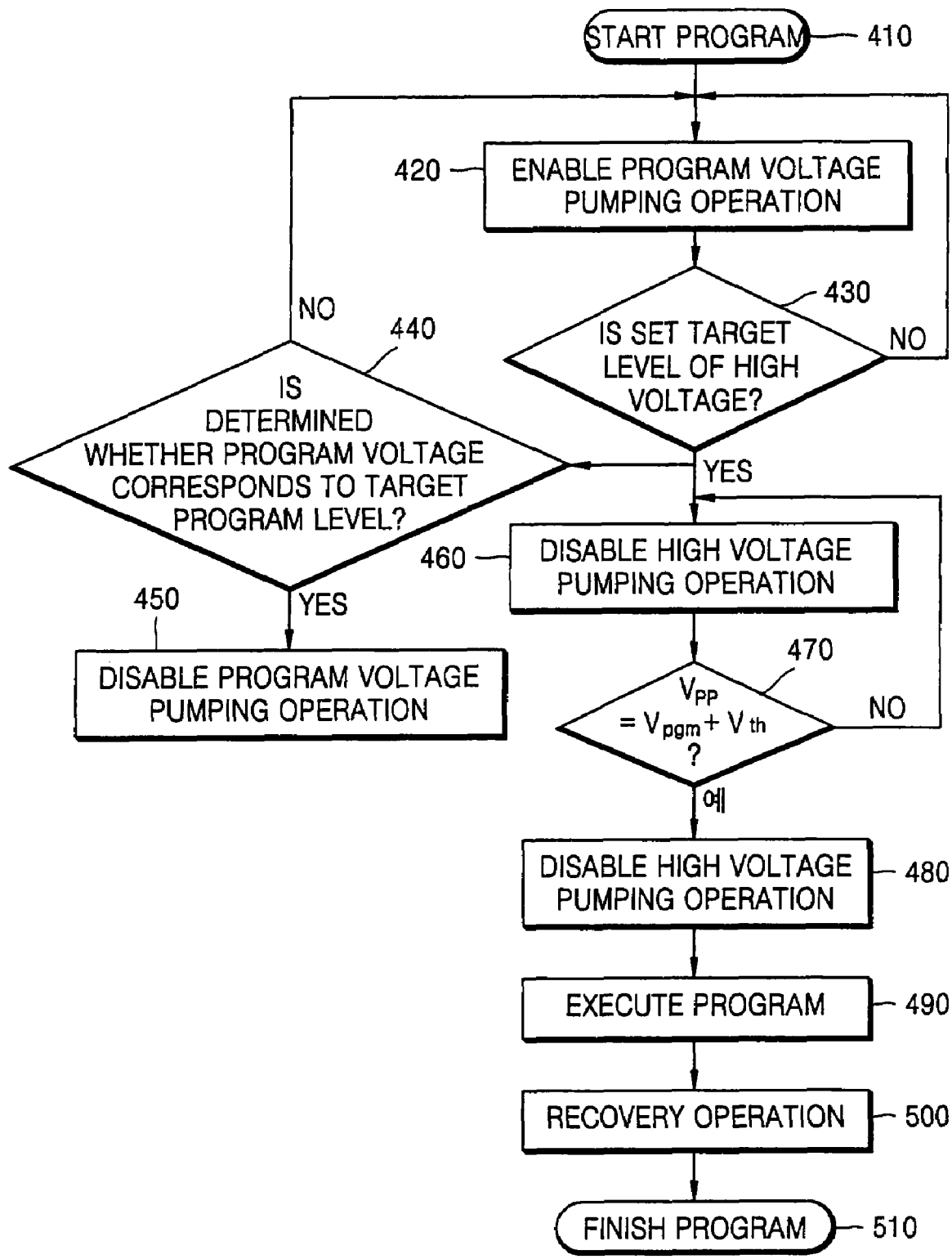
FIG. 4 is a flow chart showing a high voltage generating method according to an embodiment.

FIG. 4 is a flow chart showing a method of generating the high voltage for a programming operation of a flash memory according to the present invention. Referring to FIG. 4, when the programming operation of the flash memory cell is started in the step 140, the program voltage pump and regulator 360 (shown in FIG. 3) is enabled to enable a program voltage pumping operation in 420. When a target level of the high voltage VPP is set in response to the program voltage Vpgm in 430, it is determined whether the program voltage Vpgm corresponds to a target program level in 440. When the program voltage Vpgm corresponds to the target program level, the program voltage pumping operation is disabled in 450.

When the program voltage Vpgm does not correspond to the target program level, the program voltage pumping operation continues in 420.

When the target level of the high voltage VPP is set in response to the program voltage Vpgm in 430, the high voltage pumping operation of the voltage pumping unit 310 (shown in FIG. 3) is enabled in 460. The high voltage pumping operation is continued until the level of the high voltage VPP corresponds to the program voltage plus the threshold voltage Vth of the transistor 320 in 460. When the high voltage VPP has the voltage level corresponding to the program voltage Vpgm plus the threshold voltage Vth of the transistor 320 according to the high voltage pumping operation, the high voltage pumping operation is disabled in 480. Then, the programming operation of the flash memory cell is executed in 490. Subsequently, the high voltage discharging unit 350 discharges the high voltage VPP to the power supply voltage VDD in 500, and the programming operation is finished in 510.

Although embodiments have been described generating a high voltage VPP for a program voltage Vpgm, one of ordinary skill in the art will understand that a high voltage VPP may be generated for any control voltage, such as a read voltage, used in a flash memory device.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of generating a high voltage for a programming operation of a flash memory device comprising:
   generating a program voltage; and
   changing the high voltage until the high voltage is substantially equal to the program voltage plus the threshold voltage of a high voltage transistor in response to a voltage passed by the high voltage transistor in response to the high voltage.

2. A method of generating a high voltage for a programming operation of a flash memory device comprising:
   generating a program voltage;
   changing the high voltage until the high voltage is substantially equal to the program voltage plus the threshold voltage of a high voltage transistor;
   controlling the high voltage transistor with the high voltage to pass the program voltage;
   comparing the voltage passed by the high voltage transistor to a reference voltage; and
   changing the high voltage in response to the comparison.

3. The method of claim 2, wherein changing the high voltage further comprises using a voltage pumping unit to change the high voltage in response to a pumping clock signal.

4. The method of claim 3, further comprising generating the pumping clock signal in response to the comparison.

* * * * *